US006669030B2

United States Patent
Tsao et al.

(10) Patent No.: US 6,669,030 B2
(45) Date of Patent: Dec. 30, 2003

(54) HOLDING STAND FOR FRAGILE PLATES

(75) Inventors: Yi-Chang Tsao, Hsinchu (TW); Chih-Chin Chang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/126,656

(22) Filed: Apr. 22, 2002

(65) Prior Publication Data

US 2002/0166826 A1 Nov. 14, 2002

(30) Foreign Application Priority Data

Apr. 25, 2001 (TW) .................................... 90206602 U

(51) Int. Cl.$^7$ ................................................ F47D 5/08
(52) U.S. Cl. ..................................................... 211/41.1
(58) Field of Search .................. 211/40, 41.1, 41.12, 211/41.14, 41.17, 41.18

(56) References Cited

U.S. PATENT DOCUMENTS 5,393,226 A * 2/1995 Groom ........................ 432/258
6,273,275 B1 * 8/2001 Kim et al. ................ 211/41.18
6,290,076 B1 * 9/2001 Sayers ........................ 211/41.1

* cited by examiner

Primary Examiner—Alvin Chin-Shue
Assistant Examiner—Sarah Purol
(74) Attorney, Agent, or Firm—Troxell Law Office PLLC

(57) ABSTRACT

A holding stand for fragile plates comprises two hold frames, at least two spacing rods and at least a lateral protect cage and/or a lower protect cage. The hold frames have hollow portions and are disposed to space apart from each other oppositely. The two spacing rods are arranged between the hold frames with two ends of each of the spacing rods being fixedly attached to the two hold frames. The respective spacing rod provides a rod section with spacing pieces being arranged thereon. The lateral protect cage and/or a lower protect cage at both ends thereof being joined to the hold frames and each protect cage has a non-solid buffering enclosure. Once each of the fragile plates is placed between any two of the spacing pieces, the respective fragile plate can keep tight contact with the lateral cages and/or the lower cage.

11 Claims, 3 Drawing Sheets

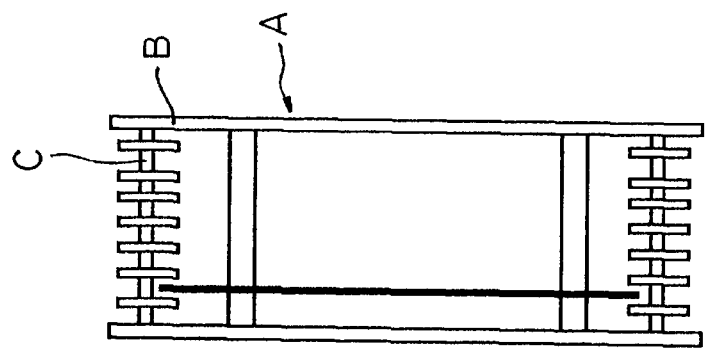
(PRIOR ART) FIG. 3
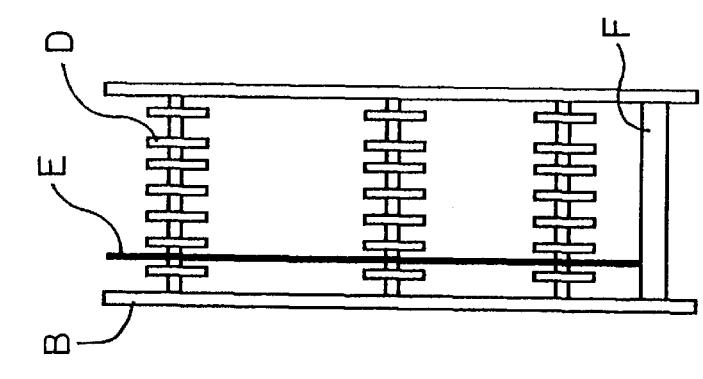
(PRIOR ART) FIG. 2
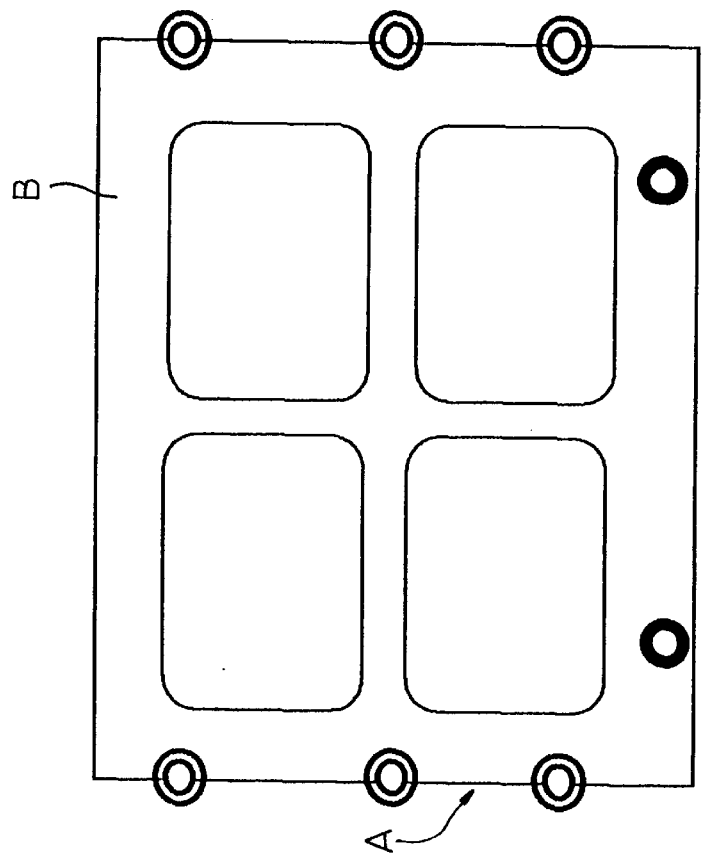
(PRIOR ART) FIG. 1

HOLDING STAND FOR FRAGILE PLATES

BACKGROUND OF THE INVENTION

1. Field of the Invention

The present invention relates to a holding stand for fragile plates. In particular, the present invention relates to a holding stand, which can be loaded with fragile plates to prevent the fragile plates from being hit under a condition of high temperature.

2. Description of Related Art

Glass sheets are popularly used in our daily life and sizes and thickness thereof are different from each other to comply with different needs. However, it is a subject worth us to care that how to place thin plates, especially, fragile plates such as glass sheets.

For a sheet of glass, a smooth surface thereof is an emphasized part and it is why a layer of guard paper has to be adhered to the smooth surface before the sheet of glass being packed. In this way, the smooth surface thereof can avoid to be scraped due to a frictional contact with another sheet of glass directly. In case of being positioned vertically, the sheet of glass is spaced apart from another sheet of glass with spacing pieces to keep off contacting with each other. The preceding way is currently used for the glass plates being placed, stored up or delivered.

When a thin glass plate is placed in a process of working, especially in a process of high temperature treatment, the change of physical property due to expansion has to be considered. For instance, while a liquid crystal display or a field radiation display is fabricated, it has to be treated with a manufacturing process of high temperature annealing and it is the most undesirable that the glass base plate frictionally collides the holding stand to cause various defects during the process. These defects may cause cracks on the glass base plate and, more seriously, the entire glass base plate may result in fracture. In order to prevent the holding stand from being deformed because of high temperature, usually the stainless steel is used as the material thereof. However, the stainless steel is rigid with high hardness and a thermal expansion under high temperature situation so that the glass base plate is not possible to be located at the holding stand tightly or to keep close contact with the holding stand. Accordingly, it is very easy for the periphery of the glass base plate to hit the holding stand.

The conventional holding apparatus for the glass base plate is illustrated in FIGS. 1 to 3 and, wherein, FIG. 1 is a left side view thereof, FIG. 2 is a front view thereof and FIG. 3 is a top view thereof, respectively. It can be seen from the figures that a holding stand A basically comprises two opposite frames B with hollowed out openings and at least two lined up rods C at two opposite sides thereof respectively. Each of the rods C is provided with a plurality of spacing disks D being disposed along the axial line thereof in a way of being parallel to each other. A gap is between any two neighboring spacing disks for placing a glass base plate E and the lowermost part of holding stand A is provided with two transverse lower rods F horizontally between the frames B so that, basically, a room can be kept between the glass base plate E at the periphery and the adjacent spacing disks respectively as soon as the glass base plate E is inserted into the holding stand. Because the glass base plate E is not tightly fitted against the frames B, the glass base plate E may move to hit the holding stand improperly caused by a loose clearance in case of the holding stand expanding due to high temperature processing.

SUMMARY OF THE INVENTION

A holding stand for fragile plates according to the present invention comprises two hold frames, at least two spacing rods and at least a lateral protect cage and/or a lower protect cage. The hold frames have hollow portions and are disposed to space apart from each other oppositely. The two spacing rods are arranged between the hold frames with two ends of each of the spacing rods being fixedly attached to the two hold frames. The respective spacing rod provides a rod section with spacing pieces being arranged thereon. The lateral protect cage and/or a lower protect cage at both ends thereof being joined to the hold frames and each protect cage has a non-solid buffering enclosure. Once each of the fragile plates is placed between any two of the spacing pieces, the respective fragile plate can keep a tight contact with the lateral cages and/or the lower cage.

BRIEF DESCRIPTION OF THE DRAWINGS

The present invention can be more fully understood by reference to the following description and accompanying drawings, in which:

FIG. 1 is a side view of a conventional holding stand for fragile plates;

FIG. 2 is a front view of a conventional holding stand for fragile plates;

FIG. 3 is a top view of a conventional holding stand for fragile plates;

DETAILED DESCRIPTION OF THE PREFERRED EMBODIMENTS

Basically, a holding stand for fragile plates according to the present invention specifically is a stand, which is suitable for holding fragile plates in a location where the temperature is changeable. The held fragile plates can be those other than preceding display panels or field radiation displays.

Referring to FIGS. 4 to 7, the holding stand for fragile plates disclosed in the present invention comprises two hold frames 1, a plurality of spacing rods 2, at least a lateral protect cage 3 for defining a lateral length and at least a lower protect cage 4 for defining a height of the bottom.

Wherein, each of the hold frames 1 has empty portions and physical portions and both of the hold frames 1 preferably has an identical size with the same shape so as to be formed by way of the same mold. Further, the two hold frames are disposed oppositely as shown in the figures.

Figure 6:
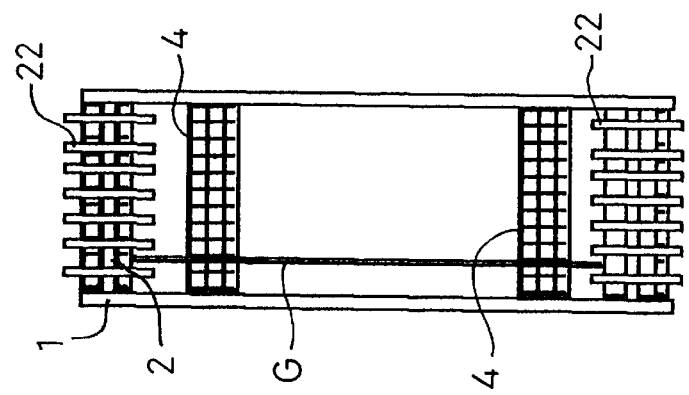
FIG. 6 is a top view of the holding stand for fragile plates shown in FIG. 4.
Figure 5:
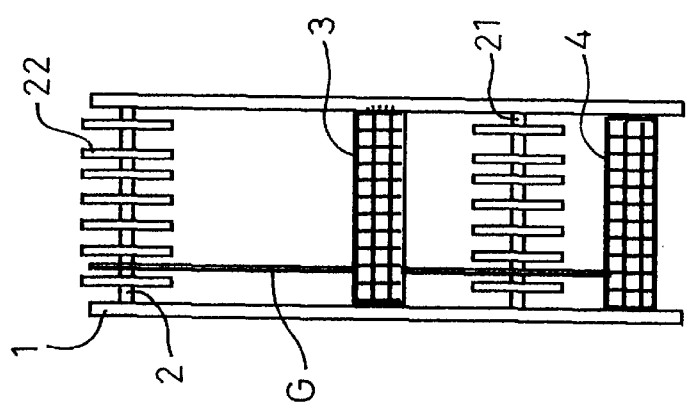
FIG. 5 is a front view of the holding stand for fragile plates shown in FIG. 4.
Figure 4:
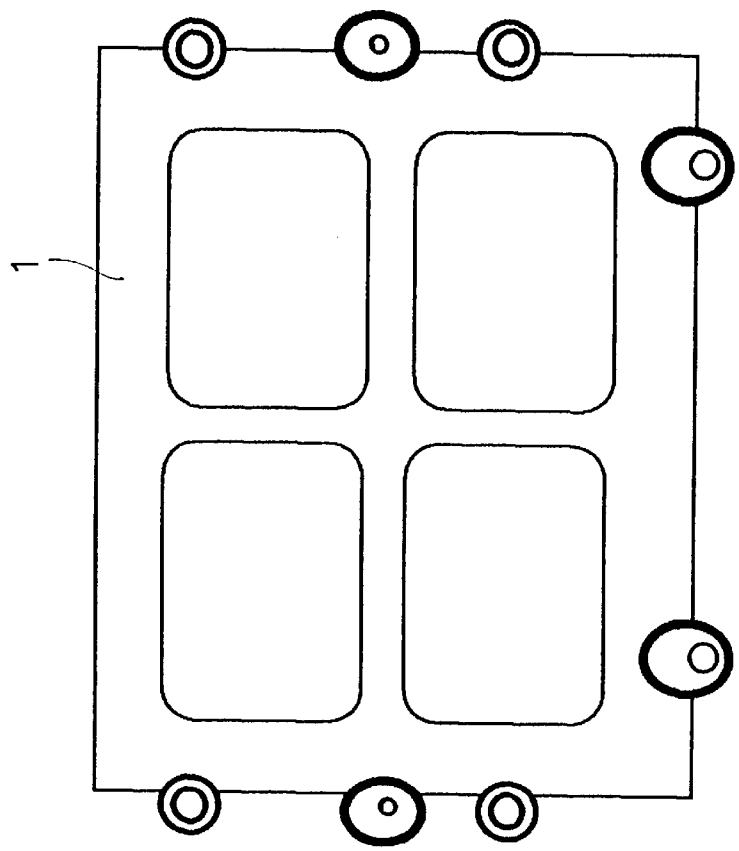
FIG. 4 is a side view of a holding stand for fragile plates according to the present invention.
Figure 7:
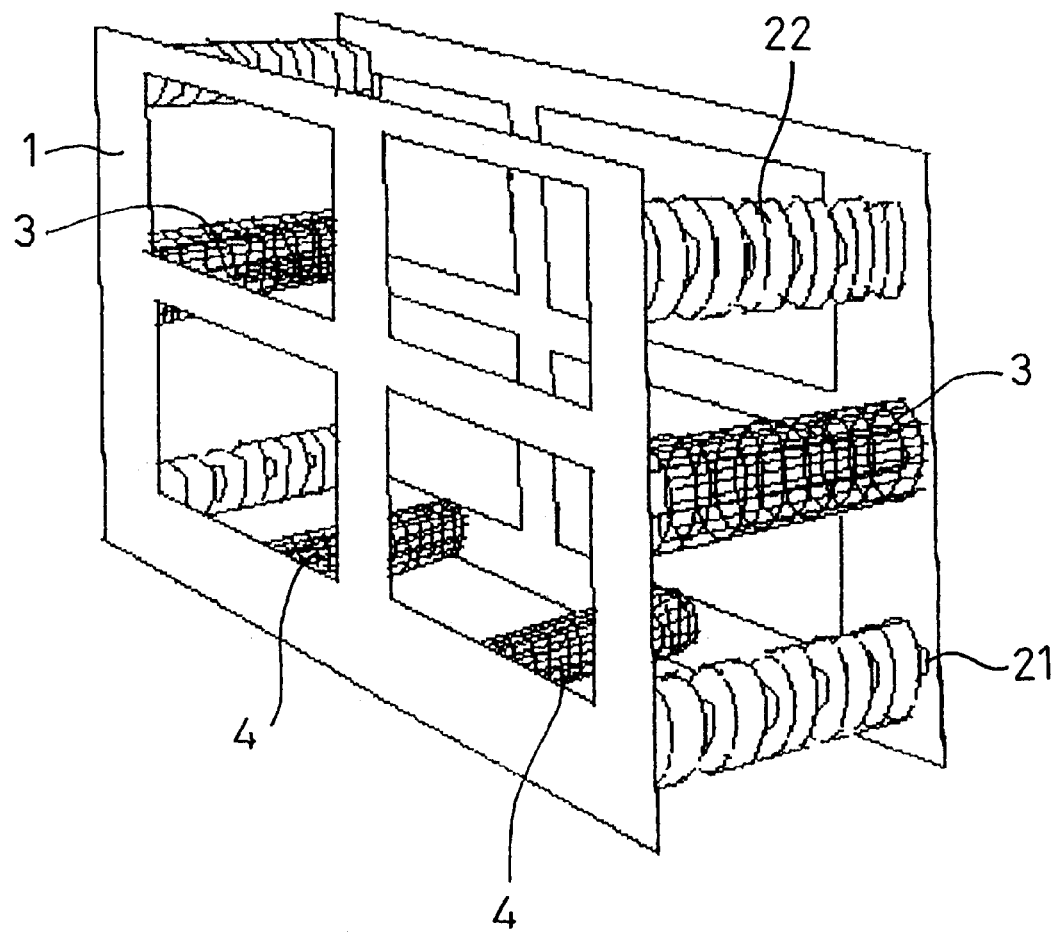
FIG. 7 is a perspective view of the holding stand for fragile plates shown in FIG. 4.

The spacing rods 2 are disposed between the hold frames 1 as connection parts and it is preferable that the spacing rods 2 are perpendicular to the hold frames 1, that is, the spacing rods 2 are oriented horizontally as the hold frames 1 are disposed vertically and oppositely. Each of the spacing rods 2 is composed of a rod section 21 and a plurality of spacing pieces 22 attached to the rod section 21 along the axial direction thereof as the conventional stand does and a space between two neighboring spacing pieces 22 can place a fragile plate. In case of multiple fragile plates with an identical thickness being placed in the holding stand, it is preferable that the respective space between any two neighboring spacing pieces 22 is equal. The spacing pieces 22 shown in FIG. 7 are circular but it is not essential, that is, the spacing pieces can be semicircular plates facing inward or any other proper shape.

The lateral protect cage 3 is made of high temperature free material such as stainless steel, titanium alloy or super alloy to offer an effect of shock absorption and impact resistance such that the lateral protect cage 3 can be formed as a shape of grid, grating, being enclosed spring strips or the like. It is the purpose of the lateral protect cage 3 that heated glass plates or fragile plates in the holding stand during processing may not hit the spacing rods 2 due to buffer provided by flexible press of protect cage 3. Hence, the lateral protect cage 3 extends inward further than respective rod part 21 of each spacing rod 2. the lateral protect cage 3 can be joined to the two hold frames directly or fit with a shaft passing over the two hold frames or fit with the spacing rods 2 directly. In case of the lateral protect cage fitting with the spacing rods 2, it is required to provide at least an additional spacing rod at the upper portion and the lower portion of the hold stand respectively such that the glass plates can be limited in a state of pressing against the protect cage 3.

The lower protect cage 4 is disposed at the bottom of the holding stand and is made of high temperature free material with an effect of anti-impact. Hence, it is preferable that the lower protect cage 4 can be form as a shape of grid, grating, being enclosed spring strips or the like. The lower protect cage 4 can be joined to the two hold frames 1 directly or fit with a shaft passing over the two hold frames or fit with one of the spacing rods 2 directly. In case of the lower protect cage 4 fitting with one of the spacing rods 2, it can avoid an increase the cost for setting up an additional mold.

Referring to FIGS. 4 to 7 again, once the fragile plates G such as glass plates are placed in the holding stand in a way of each fragile plate being located at a gap between two neighboring spacing pieces 22, a high temperature working can be processed to the fragile plates. In case of fragile plates G displacing due to a size variation thereof resulting from heat, the protect cage can absorb the possible impact by way of the elasticity or flexibility thereof so that the fragile plates G keep contact with protect cages tightly so as to prevent the fragile plates from hurt or defect.

As the foregoing, it is appreciated that advantages of the present invention can be summarized in the following:

(1) The protect cages are arranged to limit the fragile plates and to keep close contact with the fragile plates so that the fragile plates can be positioned very well to mitigate the vibration and the sliding resulting from the turbulence or the high temperature expansion during high temperature annealing process. Hence, collisions due to movements of the fragile plates can be lessened tremendously.

(2) Each of the protect cages is provided with a shape of grate type, grid type or enclosure type so that an excellent heat insulation can be obtained and an even temperature distribution can be reached for the fragile plates to be of great benefit to the original phenomenon of local uneven temperature.

(3) The protect cages are designed with a function of buffer so that the fragile plates can be free from being hit during being placed in or taken out from the holding stand of the present invention so as to reduce the defection caused by personal operation.

While the invention has been described with reference to the preferred embodiment thereof, it is to be understood that modifications or variations may be easily made without departing from the spirit of this invention, which is defined by the appended claims.

What is claimed is:

1. A holding stand for fragile plates comprising:
    a) two holding frames having a plurality of hollow portions;
    b) a plurality of spacing rods, each spacing rod connected to each of the two holding frames at opposing ends thereof, each of the spacing rods having a rod section and a plurality of spacing pieces spaced apart on the rod section;
    c) at least one lateral protect cage having a non-solid buffering enclosure, the at least one lateral protect cage connected to the two holding frames such that each lateral protect cage provides a buffer to prevent at least one fragile plate from hitting the rod sections of the spacing rods; and
    d) at least one lower protect cage having a non-solid buffering enclosure, the at least one lower protect cage connected to the two holding frames, such that each plate is placed between two spacing pieces of at least one spacing rod, and buffered by the lower protect cages.

2. The holding stand for fragile plates according to claim 1, wherein the spacing pieces are equally spaced.

3. The holding stand for fragile plates according to claim 1, wherein the spacing pieces have a circular shape.

4. The holding stand for fragile plates according to claim 1, wherein the spacing pieces have a semicircular shape.

5. The holding stand for fragile plates according to claim 1, wherein each lateral protect cage comprises a shaft inserted through the lateral protect cage and connected to each of the two holding frames at opposing ends thereof.

6. The holding stand for fragile plates according to claim 1, wherein each lateral protect cage is made from a material selected from a group consisting of stainless steel, titanium alloy, and super alloy.

7. The holding stand for fragile plates according to claim 1, wherein the non-solid buffering enclosure of each lateral protect cage has a shape selected from a group consisting of a grid, a grating, and spring strips.

8. The holding stand for fragile plates according to claim 1, wherein:
    a) the plurality of spacing rods comprise four spacing rods, a first two of the four spacing rods located at a first side of the holding stand, and a second two of the four spacing rods located at a second side of the holding stand;
    b) the at least one lateral protect cage comprises two lateral protect cages, a first of the two lateral protect cages being located between the first two of the four spacing rods and a second of the two lateral protect cages being located between the second two of the four spacing rods; and
    c) the at least one lower protect cage comprises two lower protect cages.

9. The holding stand for fragile plates according to claim 1, wherein each lower protect cage has a shape selected from a group consisting of a grid, a grating, and spring strips.

10. The holding stand for fragile plates according to claim 1, wherein each lower protect cage comprises a shaft inserted through the lower protect cage and connected to each of the two holding frames at opposing ends thereof.

11. The holding stand for fragile plates according to claim 1, wherein the plurality of spacing rods, the at least one lateral protect cage, and the at least one lower protect cage are the same length.

\* \* \* \* \*